United States Patent [19]

Iwamoto et al.

[11] 4,342,011
[45] Jul. 27, 1982

[54] SURFACE ACOUSTIC WAVE DEVICE

[75] Inventors: Hisao Iwamoto; Noboru Wakatsuki, both of Kawasaki, Japan

[73] Assignee: Fujitsu Limited, Kawasaki, Japan

[21] Appl. No.: 190,645

[22] Filed: Sep. 25, 1980

[30] Foreign Application Priority Data

Sep. 25, 1979 [JP] Japan .................. 54-121933

[51] Int. Cl.³ .............. H03H 9/25; H03H 9/42; H03H 9/64; H03H 9/66
[52] U.S. Cl. .................. 333/151; 333/153; 333/193; 333/195
[58] Field of Search .............. 333/150–155, 333/193–196; 310/313 R, 313 A, 313 B, 313 C, 313 D

[56] References Cited

U.S. PATENT DOCUMENTS

| 3,596,211 | 7/1971 | Dias et al. | 333/194 |
| 3,662,293 | 5/1972 | De Vries | 333/151 |
| 4,060,833 | 11/1977 | Onyshkevych | 310/313 C X |
| 4,146,851 | 3/1979 | Dempsey et al. | 333/194 |

FOREIGN PATENT DOCUMENTS 2395643 1/1979 France .

OTHER PUBLICATIONS

Marshall–"New Technique for the Suppression of Triple-Transit Signals in Surface-Acoustic-Wave Delay Lines, Electronics Letters", vol. 8, No. 12, Jun. 15, 1972, pp. 311-312.

Primary Examiner—Marvin L. Nussbaum
Attorney, Agent, or Firm—Staas & Halsey

[57] ABSTRACT

A surface acoustic wave device comprising a piezoelectric substrate, an input transducer and an output transducer arranged diagonally to each other. A multistrip coupler is interposed between the input and output transducers. A reflecting transducer is placed opposite to the input transducer with the multistrip coupler therebetween. The multistrip coupler includes an adjusted number of conductors. The reflecting transducer includes weighted electrodes, and means for adjusting phase difference, whereby the surface acoustic waves reflected by the output transducer and the reflecting transducer are cancelled by each other. Accordingly, triple transit echo (TTE) can be suppressed without use of external variable resistors and inductors.

5 Claims, 8 Drawing Figures

SURFACE ACOUSTIC WAVE DEVICE

BACKGROUND OF THE INVENTION

The present invention relates to a surface acoustic wave device.

Recently, surface acoustic wave devices have been used as a band pass filter, a delay line, or the like. Some examples of conventional surface acoustic wave devices will be described below with reference to FIGS. 1 through 4, of the accompanying drawings.

Figure 1:
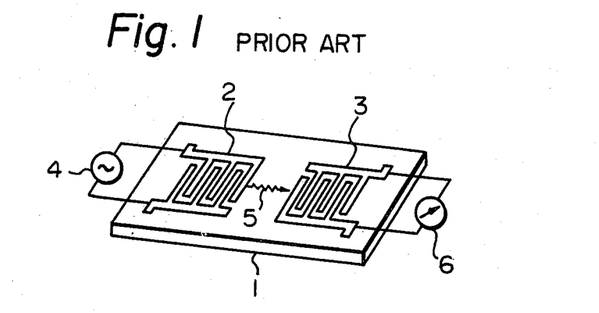
FIG. 1 is a perspective view illustrating a conventional surface acoustic wave device.

FIG. 1 illustrates a fundamental construction of a surface acoustic wave device serving as a band pass filter. This surface acoustic wave device comprises a substrate 1, which is made of a piezoelectric material, such as lithium niobate (LiNbO$_3$) or lithium tantalate (LiTaO$_3$), and is provided on the surface thereof with an input transducer 2 and an output transducer 3, each of which is composed of a pair of separated, interdigitated comb-shaped electrodes. When electrical signals from a generator 4 are applied to the electrodes of the input transducer 2, the latter emits surface acoustic waves 5, which are propagated to the output transducer 3 and then converted into other electrical signals which can be taken out from a load impedance 6. The electrodes of the input and output transducers can be designed in a variety of patterns, so as to provide various desired characteristics to the filter when electrical signals are converted into acoustic signals or vice versa. However, there is a problem that, in addition to surface acoustic waves, the input transducer also emits bulk waves which are propagated through the body of the substrate so as to reach the output transducer, adversely affecting its output characteristics.

Figure 2:
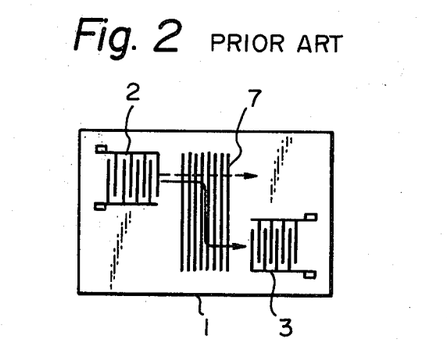
FIG. 2 is a plan view illustrating a conventional surface acoustic wave device provided with a multistrip coupler.
Figure 3:
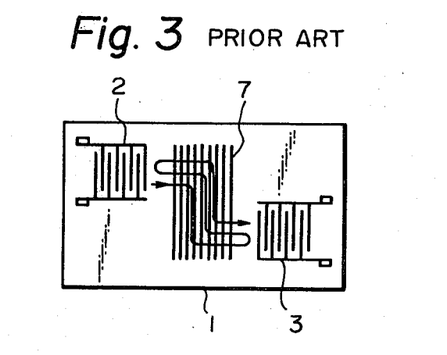
FIG. 3 is a view used to explain the triple transit echo (TTE) of the surface acoustic wave device in FIG. 2.

In order to eliminate the above mentioned problem, in a conventional device, as illustrated in FIG. 2, the input transducer 2 and the output transducer 3 are arranged diagonally to each other, and a multistrip coupler 7 which includes a plurality of parallel conductors is provided between the input and output transducers. Energy of the surface acoustic waves emitted by the input transducer 2 is converted into electrical energy and then emitted again in the form of surface acoustic waves by the multistrip coupler 7, so that the path of propagation of the surface acoustic waves is changed, as indicated by a solid line. As a result, the effect of the bulk waves which are propagated, as indicated by a dotted arrow, is eliminated. In this case, however, there is a problem, as illustrated in FIG. 3, in that the surface acoustic waves are reflected by the output transducer 3, then propagated back to the input transducer 2 through the multistrip coupler 7, and are reflected again to reach the output transducer 3 through the multistrip coupler 7, thereby resulting in the occurrence of a so-called triple transit echo (hereinafter referred to as TTE), which deteriorates the characteristics of the filter.

Figure 4:
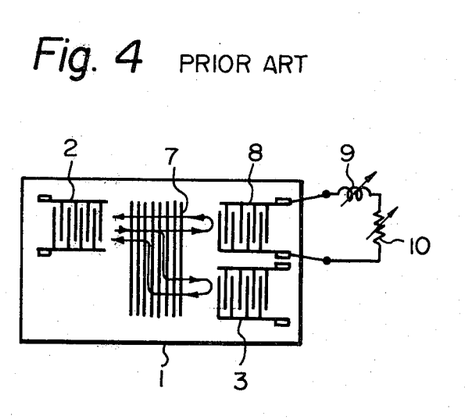
FIG. 4 is a plan view illustrating a conventional surface acoustic wave device provided with a reflecting transducer for the suppression of the TTE.

In order to suppress such TTE, a conventional device has been proposed, as illustrated in FIG. 4. This device is provided with a reflecting transducer 8 for reflection of the surface acoustic waves. This transducer is composed of a pair of separated, interdigitated comb-shaped electrodes and is arranged opposite to the input transducer 2 with the multistrip coupler 7 therebetween. The number of conductors of the multistrip coupler 7 can be adjusted so that all of the surface acoustic waves emitted by the input transducer 2 are not caused to change their path of propagation, but a part thereof goes straight and is reflected by the reflecting transducer 8.

As a result, the waves reflected by the output transducer 3 and the waves reflected by the reflective transducer 8 are cancelled by each other. The main point of this device is that the intensity of the reflected waves from the output transducer 2 and the intensity of the reflected waves from the reflecting transducer 8 are adjusted by means of a variable resistor and a variable inductor. Also the arrangement is designed so that both sets of reflected waves are in inverse phase with each other. The intensity adjustment for both sets of reflected waves of the conventional device illustrated in FIG. 4 requires a variable inductance coil 9 and a variable resistor 10, which are inserted between the electrodes of the reflective transducer 8. As a result, there is a problem in that the device is increased in size and in cost due to the variable inductance coil and the variable resistor.

SUMMARY OF THE INVENTION

It is a primary object of the present invention to provide a surface acoustic wave device in which the TTE can be effectively suppressed and which has good frequency characteristics.

Another object of the present invention is to provide a surface acoustic wave device which is small in size and is low in price.

According to the present invention, there is provided a surface acoustic wave device which comprises a combination of various of the following elements, one of which is a substrate made of piezoelectric material and having a plane surface for propagation of surface acoustic waves. Another is an input transducer formed on the substrate surface, for converting electrical signals into surface acoustic waves. Another is an output transducer formed on the substrate surface and arranged diagonally to the input transducer, for converting the surface acoustic waves into electrical signals. Another is multistrip coupler formed on the substrate surface and interposed between the input and output transducers so as to be substantially orthogonal or perpendicular to the propagation direction of the surface acoustic waves. The multistrip coupler includes a plurality of parallel conductors. Another is a reflecting transducer formed on the substrate surface and arranged opposite to the input transducer with the multistrip coupler in between them, and positioned so as to be parallel to the output transducer. The reflecting transducer includes electrodes and is adapted to reflect the surface acoustic waves. The electrodes of the reflecting transducer are adjusted by being weighted and the number of conductors in the multistrip coupler can also be adjusted, whereby the intensity of reflection of surface accoustic waves from the output transducer is equal to the intensity of reflection of the surface acoustic waves from the reflecting transducer. Also included is a means for adjusting a phase difference between the reflections so that it equals $(2n-1)\lambda/2$, where "$\lambda$" is a wavelength at a center frequency of the surface acoustic waves and "n" is a positive integral number.

Preferably, the phase difference adjusting means comprises phase adjusting strips formed on the substrate surface and interposed between the reflecting transducer and the multistrip coupler. The strips should include a plurality of parallel conductors.

It is also preferred that the phase difference adjusting means comprises an arrangement in which the reflecting transducer is shifted by $(2n-1)\lambda/4$ relative to the output transducer in the direction orthogonal to the multistrip coupler.

The present invention will be become more apparent from the description of preferred embodiments set forth below with reference to the accompanying drawings.

DESCRIPTION OF THE PREFERRED EMBODIMENTS

Figure 5:
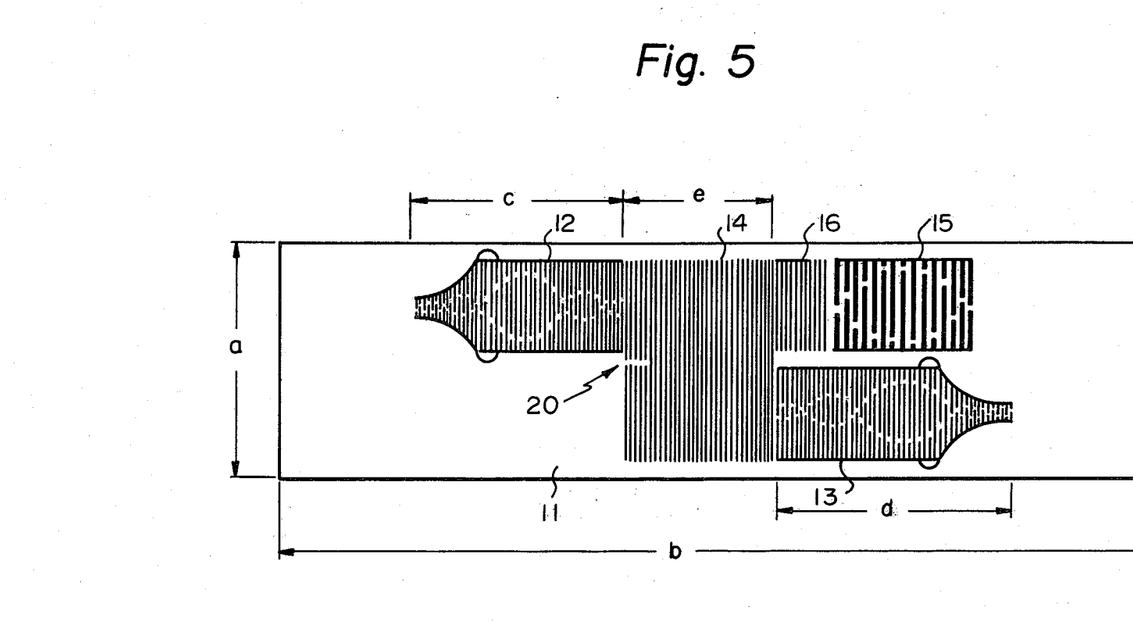
FIG. 5 is a plan view of an embodiment of a surface acoustic wave device according to the present invention.

Referring to FIG. 5, an embodiment of a surface acoustic wave device according to the present invention comprises a substrate 11 which is made of a piezoelectric material. The substrate is provided on a plane surface thereof with an input transducer 12, an output transducer 13, a multistrip coupler 14, a reflecting transducer 15 and phase adjusting strips 16. These elements are formed by etching an aluminum layer of vapor deposition by means of a photolithographic technology. The input transducer 12 and the output transducer 13 are arranged diagonally to each other with the multistrip coupler 14 therebetween. Each of the input and output transducers includes "bamboo blind" shaped electrodes and has a construction in which the pitch (i.e. center-to-center spacing) of the electrodes is λ/4 and the width of the electrodes is λ/8, where λ is a wavelength at the center frequency of the surface acoustic wave, and the electrodes are weighted to provide the desired frequency characteristics. The multistrip coupler 14 is arranged so as to be substantially orthogonal to the propagation direction of the surface acoustic waves, and includes a plurality of parallel conductors. The reflecting transducer 15 is arranged opposite to the input transducer 12, with the multistrip coupler 14 therebetween, and parallel to the output transducer 13. The reflecting transducer 15 includes electrodes and has a construction in which the pitch of the electrodes is λ/2, the width of the electrodes is λ/4, and the electrodes are weighted to provide desired frequency characteristics. The phase adjusting strips 16 include a plurality of parallel conductors and are interposed between the multistrip coupler 14 and the reflecting transducer 15.

Figure 6:
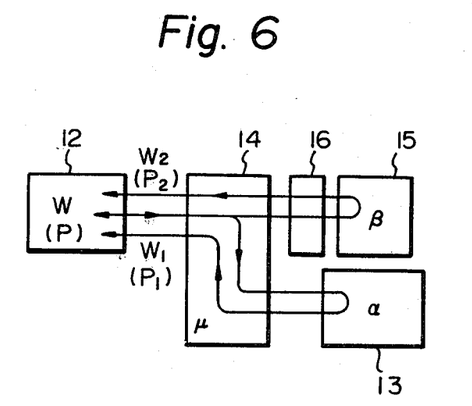
FIG. 6 is a view used to explain the suppression of the TTE in the embodiment of the device in FIG. 5.

The path of propagation of the greater part of the surface acoustic waves emitted by the input transducer 12 is caused to change by virtue of the multistrip coupler 14 and reaches the output transducer 13. However, the number of conductors of the multistrip coupler 14 is adjusted, so that not all of the surface acoustic waves emitted by the input transducer are caused to change their path of propagation. Rather a part thereof is allowed to go straight to reach the reflecting transducer 15 through the phase adjusting strips 16. Therefore, as illustrated in FIG. 6, the surface acoustic waves W emitted by the input transducer 12 are reflected by the output transducer 13 and the reflecting transducer 15, and both sets of reflected waves $W_1$ and $W_2$ are returned to the input transducer 12.

In order to suppress the above mentioned TTE, it is necessary that both sets of reflected waves $W_1$ and $W_2$ are cancelled by each other. For this purpose, the intensity (or the amount of reflection) of, and the phase difference between, the sets of reflected waves $W_1$ and $W_2$, must satisfy the requirements set forth below.

First, the intensity of both sets of reflected waves $W_1$ and $W_2$ are defined as follows.

$$P_1 = 2\mu\alpha P$$

$$P_2 = 2(1-\mu)\beta P$$

where,

P: Intensity of the surface acoustic waves W emitted by the input transducer $P_1$: Intensity at the input transducer of the reflected waves $W_1$ from the output transducer $P_2$: Intensity at the input transducer of the reflected waves $W_2$ from the reflecting transducer μ: Efficiency of transformation of the multistrip coupler α: Reflection factor of the output transducer β: Reflection factor of the reflecting transducer The cancellation of the sets of reflected waves $W_1$ and $W_2$ by each other must meet the following requirement:

$$P_1 = P_2$$

$$\therefore \mu\alpha = (1-\mu)\beta$$

According to the present invention, the adjustment of the intensity of the sets of reflected waves $W_1$ and $W_2$ is achieved by weighting the electrodes of the reflecting transducer 15 and by adjusting the number of conductors of the multistrip coupler 14. The weighting of the electrodes of the reflecting transducer 15 results in the adjustment of the reflection factor β. The adjustment of the number of conductors of the multistrip coupler 14 results in the adjustment of the transformation efficiency μ. The adjustment of the number of conductors of the multistrip coupler can be performed in the following manner. A number of conductors of the multistrip coupler which provide a transformation efficiency of 100% is preliminarily formed, and then an appropriate number of conductors is cut by means of a laser, as indicated by the reference numeral 20 in FIG. 5, so that the desired transformation efficiency is attained. Therefore, without the use of the variable inductance coil and the variable resistor, such as in the conventional device shown in FIG. 4, the intensity $P_2$ of the reflected waves $W_2$ from the reflecting transducer 15 can be adjusted to be substantially equal to the intensity $P_1$ of the reflected waves $W_1$ from the output transducer 13.

It is desired that both the input transducer 12 and the output transducer 13 have constructions in which the pitch of electrodes is λ/4, so that reflection of the surface acoustic waves is suppressed as much as possible, and it is also desired that the reflecting transducer 15 has a construction in which the pitch of the electrodes is λ/2, so that the amount of reflection is as great as possible.

Furthermore, the cancellation of the reflected sets of waves $W_1$ and $W_2$ by each other must meet the requirement that the phase difference between both sets of reflected waves is $(2n-1)\pi$, i.e. $(2n-1)\lambda/2$, where "n" is a positive integral number. For this purpose, the phase adjusting strips 16 are provided, by virtue of which the phase of the reflected waves $W_2$ from the reflecting transducer 15 can be appropriately adjusted. This adjustment of phase can be achieved by adjusting the number, width and the pitch of conductors of the strips 16, or by short-circuiting the ends thereof.

As stated above, the sets of reflected waves $W_1$ and $W_2$ are adjusted so that the intensity thereof are substantially equal to each other and the phase difference is $(2n-1)\lambda/2$, resulting in the cancellation of the sets of reflected waves $W_1$ and $W_2$ by each other. As a result, the TTE can be suppressed, whereby the frequency characteristics of the surface acoustic wave filter can be improved.

Figure 8:
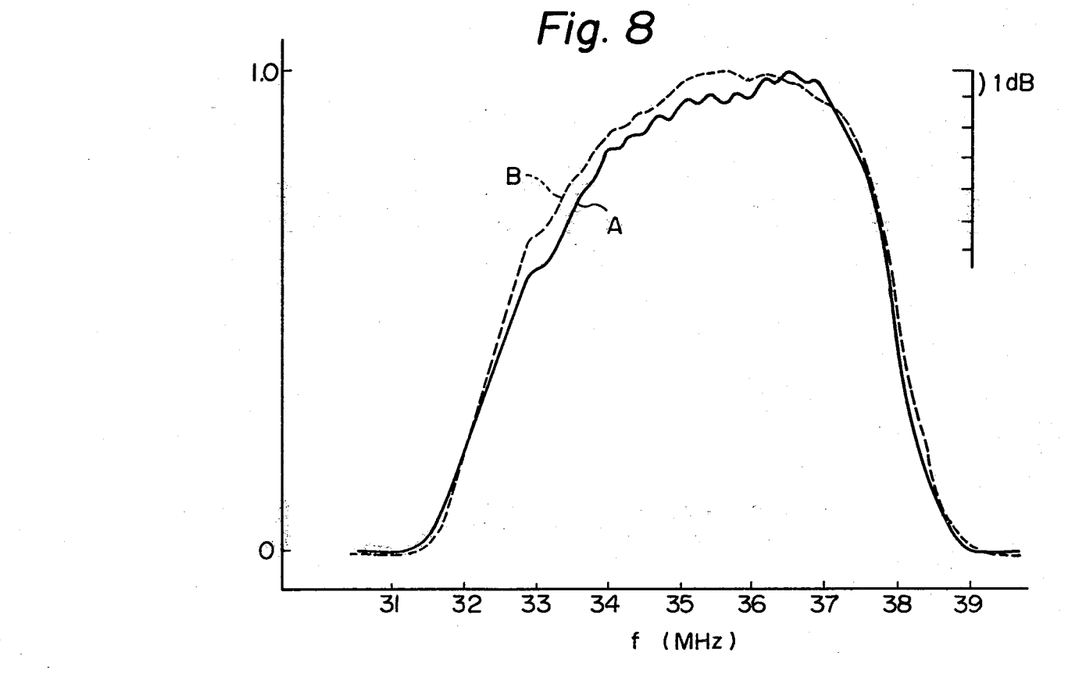
FIG. 8 is a graph illustrating frequency characteristics of the surface acoustic wave device according to the present invention illustrated in FIG. 5, in comparison with that of the conventional surface acoustic wave device illustrated in FIG. 2.

FIG. 8 illustrates the frequency characteristics of the surface acoustic wave device according to the present invention illustrated in FIG. 5, in comparison with that of the conventional surface acoustic device illustrated in FIG. 2. Each of these devices has a center frequency of 36 MHz and a frequency band of 7 MHz. The device according to the preferred embodiment of the present invention is manufactured with the following conditions.

(1) General dimensions
   a = 3,500μ
   b = 12,000μ
   c = 3,000μ
   d = 3,600μ
   e = 2,000μ
(2) Input transducer 12
   Number of electrodes: 130
   Pitch of electrodes: 27μ
   Width of electrode: 14μ
   Cross-width: 1.5 mm
(3) Output transducer 13
   Number of electrodes: 140
   Pitch of electrodes: 28μ
   Width of electrode: 14μ
   Cross-width: 1.5 mm
(4) Multistrip coupler 14
   Number of conductors: 77 (110 conductors are preliminarily formed and 33 conductors are cut to adjust the transformation efficiency)
   Pitch of conductors: 29μ
   Width of conductor: 15μ
   Length: 3.2 mm
(5) Reflecting transducer 15
   Number of electrodes: 60
   Pitch of electrodes: 56μ
   Width of electrode: 28μ
   Cross-width: 1.5 mm
(6) Phase adjusting strips 16
   Number of conductors: 32
   Pitch of electrodes: 28μ
   Width of electrode: 14μ
   Length: 1.5 mm In FIG. 8, the abscissa represents a frequency and the ordinate represents a response (in linear scale). A curve "A" (solid line) represents the characteristics of the conventional device, and a curve "B" (dotted line) represents the characteristics of the device according to the present invention. It will be understood from this figure that the conventional device produces ripples of about 0.36 dB, while the device according to the present invention produces ripples of 0.2 dB. This fact demonstrates the effect of suppressing the TTE.

Figure 7:
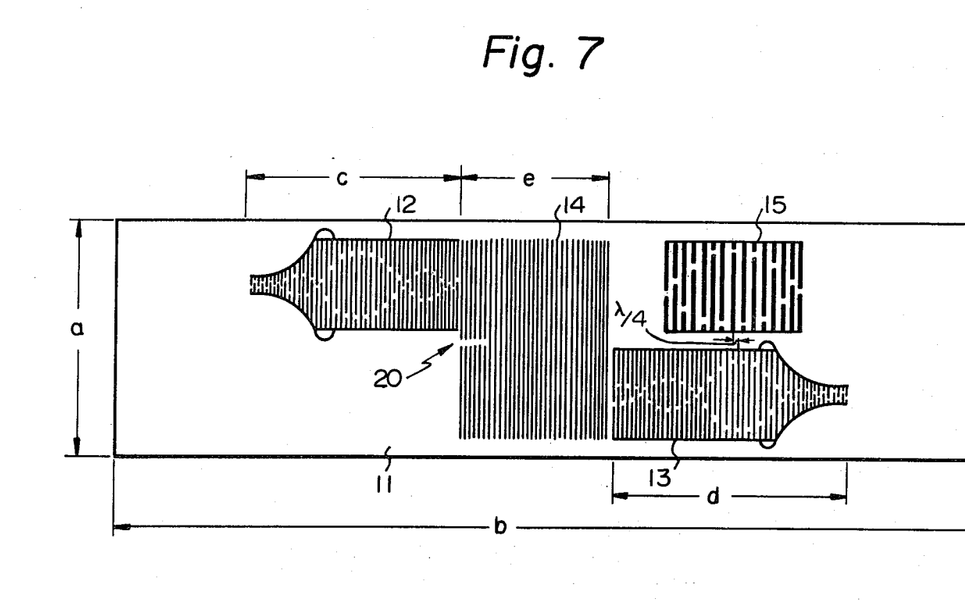
FIG. 7 is a plan view of another embodiment of a surface acoustic wave device according to the present invention.

Although the embodiment mentioned above is provided with metal strips for adjusting the phase of the reflected waves, the present invention is not limited thereto. It is also allowable to shift the arrangement of the reflecting transducer 15 by $(2n-1)\lambda/4$, relative to the output transducer 13, in the direction orthogonal to the multistrip coupler 14 and parallel to the direction of travel of the surface waves, so that the phase difference between the sets of reflected waves $W_1$ and $W_2$ is $(2n-1)\lambda/2$. In a second embodiment illustrated in FIG. 7, for example, the arrangement of the reflecting transducer 15 is shifted by λ/4 with respect to the output transducer 13.

As mentioned above, the present invention provides a surface acoustic wave device, in which the number of conductors of the multistrip coupler is adjusted and the electrodes of the reflecting transducer are weighted so that the intensity of, and the phase difference between, the sets of reflected waves from the output transducer and the reflecting transducer are adjusted, whereby the TTE can be suppressed over a wide range of frequencies. Accordingly, a surface acoustic wave device having good frequency characteristics can be provided.

Furthermore, the device according to the present invention does not need a variable inductance coil or the like used in the prior art, and thus can be constructed with a reduced number of parts. Accordingly, a surface acoustic wave device which is low in price and small in size can be provided.

It should be appreciated that the invention has been described above in detail with particular reference to the preferred embodiments thereof, but these do not limit the scope of the device described and claimed. Variations and modifications can be made thereto within the spirit and scope of the invention.

We claim:
1. A surface acoustic wave device comprising:
   a substrate made of piezoelectric material and having a plane surface for propagation of surface acoustic waves;
   an input transducer formed on said substrate surface, for converting electrical signals into surface acoustic waves;
   an output transducer formed on said substrate surface and arranged diagonally to said input transducer, for converting said surface acoustic waves into electrical signals;
   a multistrip coupler formed on said substrate surface and interposed between said input and output transducers to as to be substantially orthogonal to the propagation direction of said surface acoustic waves, said coupler including a plurality of parallel conductors;
   a reflecting transducer formed on said substrate surface and arranged opposite to said input transducer with said multistrip coupler therebetween and parallel to said output transducer, the reflecting trans- ducer including electrodes and adapted to reflect said surface acoustic waves;

said electrodes of said reflecting transducer being weighted and the number of conductors of said multistrip coupler being adjusted, whereby the intensity of reflection of said surface acoustic waves by said output transducer is equal to the intensity of reflection of said surface acoustic waves by said reflecting transducer; and means for adjusting to a phase difference between said reflections so as to be $(2n-1)\lambda/2$, where "$\lambda$" is a wavelength at a center frequency of said surface acoustic waves and "n" is a positive integral number, said phase difference adjusting means comprising phase adjusting strips formed on said substrate surface and interposed between said reflecting transducer and said multistrip coupler, said phase adjusting strips including a plurality of parallel conductors.

2. A device according to claim 1, wherein said phase difference adjusting means further comprises an arrangement in which said reflecting transducer is shifted by $(2n-1)\lambda/4$ relative to the output transducer in the direction orthogonal to the multistrip coupler.

3. The device according to claim 1 or 2, wherein each of said input and output transducers includes weighted electrodes and has a construction in which the pitch of the electrodes is $\lambda/4$ and the width of the electrodes is $\lambda 8$, and wherein said reflecting transducer has a construction in which the pitch of the electrodes is $\lambda/2$ and the width of the electrodes is $\lambda/4$.

4. The device according to claim 1 or 2, wherein said multi-strip coupler is formed so as to be 100 percent efficient, and adjustable according to a technique of cutting a predetermined number of conductors comprising said multi-strip coupler, so as to equalize the intensity of reflection of said surface acoustic waves by said output transducer to the intensity of reflection of said acoustic waves by said reflecting transducer.

5. A device according to claim 3, wherein a frequency response curve of said surface acoustic wave device exhibits ripples of 0.2 dB or less.

* * * * *

UNITED STATES PATENT AND TRADEMARK OFFICE
CERTIFICATE OF CORRECTION

PATENT NO. : 4,342,011

DATED : Jul. 27, 1982

INVENTOR(S) : Iwamoto et al.

It is certified that error appears in the above-identified patent and that said Letters Patent is hereby corrected as shown below:

```
Column 2, line 8, after "Also" insert --,--.
Column 6, line 61, "to" (first occurrence) should be --so--.
```

Signed and Sealed this

Eleventh Day of January 1983

[SEAL]

Attest:

GERALD J. MOSSINGHOFF

Attesting Officer

Commissioner of Patents and Trademarks